United States Patent
Perone et al.

(10) Patent No.: US 11,290,617 B2
(45) Date of Patent: Mar. 29, 2022

(54) DOCUMENT SECURITY

(71) Applicant: Hewlett-Packard Development Company, L.P., Spring, TX (US)

(72) Inventors: Christian Perone, Porto Alegre (BR); Thomas Paula, Porto Alegre (BR)

(73) Assignee: Hewlett-Packard Development Company, L.P., Spring, TX (US)

( * ) Notice: Subject to any disclaimer, the term of this patent is extended or adjusted under 35 U.S.C. 154(b) by 96 days.

(21) Appl. No.: 16/498,992

(22) PCT Filed: Apr. 20, 2017

(86) PCT No.: PCT/US2017/028493
§ 371 (c)(1),
(2) Date: Sep. 27, 2019

(87) PCT Pub. No.: WO2018/194603
PCT Pub. Date: Oct. 25, 2018

(65) Prior Publication Data
US 2020/0053249 A1    Feb. 13, 2020

(51) Int. Cl.
*H04N 1/44*    (2006.01)
*G06K 9/00*    (2006.01)
(Continued)

(52) U.S. Cl.
CPC .......... *H04N 1/444* (2013.01); *G06K 9/00463* (2013.01); *G06K 9/6217* (2013.01); *G06N 5/003* (2013.01)

(58) Field of Classification Search
CPC .. H04N 1/444; G06K 9/00463; G06K 9/6217; G06K 2009/0059; G06K 9/6272; G06K 9/00422; G06K 9/4628; G06K 9/00483; G06N 5/003; G06T 1/00; G11C 7/24
See application file for complete search history.

(56) References Cited

U.S. PATENT DOCUMENTS

| 5,647,010 A | 7/1997 | Okubo et al. |
| 7,961,950 B2 | 6/2011 | Sato |

(Continued)

FOREIGN PATENT DOCUMENTS

| CN | 104318203 | 1/2015 |
| EP | 04827427 | 4/1991 |

(Continued)

OTHER PUBLICATIONS

Baaziz, N., et al, Content-based Image Copy Detection Using Dual Signatures, Dec. 14-17, 2011, <http://ieeexplore.ieee.org/document/6151529/> ~ 6 pages.

*Primary Examiner* — Ming Y Hon
(74) *Attorney, Agent, or Firm* — Dicke Billig & Czaja PLLC

(57) ABSTRACT

Examples disclosed herein relate to extracting a plurality of features from a document according to a heuristic extraction model, generating a vector representation of the document according to the plurality of extracted features, associating at least one security rule with the document, determining if a received vector representation matches the stored vector representation of the document, and providing a response to a requested action on the document according to the determination.

15 Claims, 4 Drawing Sheets

(51) Int. Cl.
*G06K 9/62* (2006.01)
*G06N 5/00* (2006.01)

(56) References Cited

U.S. PATENT DOCUMENTS

| | | | |
|---|---|---|---|
| 8,120,795 B2 | 2/2012 | Qi et al. | |
| 9,022,291 B1* | 5/2015 | van der Merwe | G06K 7/12 235/469 |
| 10,867,171 B1* | 12/2020 | Contryman | G06N 20/20 |
| 2002/0065845 A1* | 5/2002 | Naito | G06F 16/3347 715/248 |
| 2003/0225763 A1* | 12/2003 | Guilak | G06F 16/353 |
| 2004/0181525 A1* | 9/2004 | Itzhak | G06F 16/3347 |
| 2005/0246300 A1* | 11/2005 | Tsukamoto | G06F 16/355 706/46 |
| 2008/0243479 A1* | 10/2008 | Cafarella | G06F 16/338 704/9 |
| 2012/0041955 A1* | 2/2012 | Regev | G06F 16/355 707/740 |
| 2012/0209853 A1* | 8/2012 | Desai | G06F 16/93 707/741 |
| 2012/0314242 A1* | 12/2012 | Kakutani | H04N 1/00867 358/1.14 |
| 2013/0103695 A1* | 4/2013 | Rarrick | G06F 40/51 707/748 |
| 2015/0199567 A1* | 7/2015 | Fume | G06K 9/00483 382/187 |
| 2015/0341370 A1* | 11/2015 | Khan | H04L 63/0861 726/30 |
| 2016/0364550 A1 | 12/2016 | Pathak | |
| 2017/0017837 A1 | 1/2017 | King et al. | |
| 2017/0286415 A1* | 10/2017 | Kumar | G06F 16/434 |
| 2017/0308795 A1* | 10/2017 | Grom | G06F 3/04847 |
| 2018/0096060 A1* | 4/2018 | Peled | G06F 16/93 |
| 2018/0129893 A1* | 5/2018 | Son | G06N 3/063 |
| 2018/0137107 A1* | 5/2018 | Buccapatnam Tirumala | G06F 40/30 |
| 2018/0308013 A1* | 10/2018 | O'Shea | H04W 24/08 |
| 2019/0213303 A1* | 7/2019 | Han | G06N 20/00 |
| 2019/0294874 A1* | 9/2019 | Orlov | G06K 9/00442 |

FOREIGN PATENT DOCUMENTS

| | | |
|---|---|---|
| WO | WO-2007138201 | 12/2007 |
| WO | WO-2013062531 A1 | 5/2013 |

\* cited by examiner

DOCUMENT SECURITY

BACKGROUND

Devices such as printers are often used to copy and/or scan documents. Similarly, devices such as laptops and/or smartphones may provide built-in cameras allowing for the capture of documents. In some situations, the documents may be subject to restrictions, such as copy protections.

BRIEF DESCRIPTION OF THE DRAWINGS

In the accompanying drawings, like numerals refer to like components or blocks. The following detailed description references the drawings, wherein.

DETAILED DESCRIPTION

Figure 1:
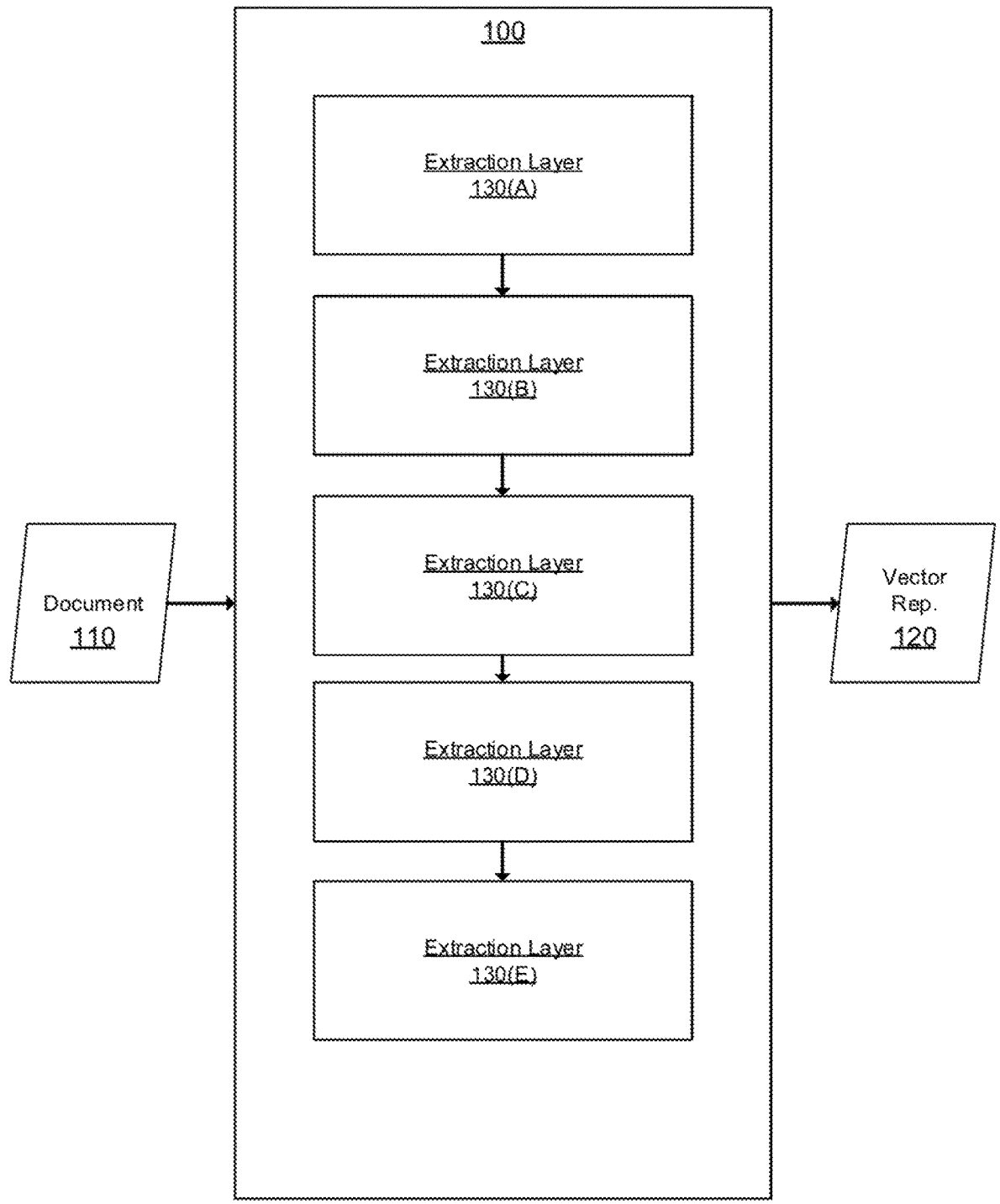
FIG. 1 is a block diagram of an example extraction model.

In some situations, devices such as multi-function printers, laptops, and/or smartphones may provide users with the capability of capturing an image of a document. Oftentimes, however, documents may be subject to restrictions on reproduction and/or sharing, such as when the document contains confidential and/or privileged information. For example, a document may comprise a person's health information, and may be restricted to being viewed and/or shared with authorized medical providers. Unrestricted devices easily allow for the capture and/or sharing of information without safeguard, but even devices with a degree of protection must capture and compare the document's privileged data in order to determine whether the document is subject to restrictions.

In some implementations discussed herein, document security may be provided without the storage of privileged and/or confidential information. This level of security may be used to prevent devices from capturing that information without permission. These implementations provide privacy and security guarantees without storing the document itself in order to check for unauthorized copies. Instead a feature vector representation extracted from the document may be stored that obfuscates the content of the document while providing a unique signature with which security rules may be associated. This feature vector representation avoids the potential reconstruction of the original document, thereby maintaining the internal security of the document in a database of protected documents.

Feature vectors, which may include image and/or textual feature vectors, may represent properties of a feature an image or properties of a textual description. For example, an image feature vector may represent edges, shapes, regions, etc. A textual feature vector may represent similarity of words, linguistic regularities, contextual information based on trained words, description of shapes, regions, proximity to other vectors, etc.

The feature vectors may be representable in a multimodal space. A multimodal space may include k-dimensional coordinate system. When the image and textual feature vectors are populated in the multimodal space, similar image features and textual features may be identified by comparing the distances of the feature vectors in the multimodal space to identify a matching image to the query. One example of a distance comparison may include a cosine proximity, where the cosine angles between feature vectors in the multimodal space are compared to determine closest feature vectors. Cosine similar features may be proximate in the multimodal space, and dissimilar feature vectors may be distal. Feature vectors may have k-dimensions, or coordinates in a multimodal space. Feature vectors with similar features are embedded close to each other in the multimodal space in vector models.

Feature-based vector representation may use various models, to represent words, images, and structures of a document in a continuous vector space. Different techniques may be applied to represent different features in the vector space, and different levels of features may be stored according to the number of documents that may need to be maintained. For example, semantically similar words may be mapped to nearby points by relying the fact that words that appear in the same contexts share semantic meaning. Two example approaches that leverage this principle comprise count-based models (e.g. Latent Semantic Analysis) and predictive models (e.g. neural probabilistic language models). Count-based models compute the statistics of how often some word co-occurs with its neighbor words in a large text corpus, and then map these count-statistics down to a small, dense vector for each word. Predictive methods directly try to predict a word from its neighbors in terms of learned small, dense embedding vectors (considered parameters of the model). Other layers may capture other features, such as font type distribution, layout, image content and positioning, color maps, etc.

The heuristic extraction model may comprise a plurality of feature extraction layers. Each layer may have a particular weight for various document types, and the weights may be adjusted as the model is exposed to additional documents. For example, certain layers related to extracting color map features for the vector representation may be more heavily weighted on documents with large areas of color images and less heavily weighted on documents largely comprised of black and white text.

FIG. 1 is a block diagram of an example extraction model 100. Extraction model 100 may receive a document 110 and output a vector representation 120 of the document 110. Upon receiving document 110 a plurality of feature extraction layers 130(A)-(E) may evaluate the document and output a plurality of features. Each layer 130(A)-(E) may output different numbers of features to be incorporated into vector representation 120.

Extraction model 100 may comprise a machine-learning based heuristic extraction model that is comprised of feature extraction layers 130(A)-(E), which may comprise stacked convolution/pooling blocks. Extraction model 100 may comprise, for example, a Convolutional Neural Network (CNN) encoding model. In some examples, a CNN model may comprise stacked convolution and pooling layers. Layers 130(A)-(E) of the CNN model may work to build a feature space, and encode k-dimensional feature vectors. For example, an initial layer 130(A) may learn first order features, e.g. color, edges etc. A second layer 130(B) may learn higher order features, e.g., features specific to the input dataset. In some examples, the CNN model may not comprise a fully connected layer for classification, e.g. a softmax layer. In some examples, a CNN model without fully connected layers for classification may enhance security, enable faster comparison and may require less storage space. The network of stacked convolution and pooling layers may be used for feature extraction. The CNN model may use the weights extracted from at least one layer of the CNN model as a representation of an image of the catalog of images. In other words, features extracted from at least one layer of the CNN model may determine a feature vector. In some examples, the weights from a 4096-dimensional fully connected layer may result in a feature vector of 4096 features. The CNN model may also learn image-sentence relationships, where sentences are encoded using long short-term memory (LSTM) recurrent neural networks. The image features from the convolutional network may be projected into the multimodal space of the LSTM hidden states to extract additional textual feature vectors. Since the same model 100 is used, the image feature vectors may be compared to an extracted textual feature vectors 134 in the multimodal space. In various examples, model 100 may comprise a TensorFlow® framework, CNN model, LSTM model, seq2seq (encoder-decoder model), a structure neutral language model (SC-NLM), etc.

In some examples, extraction layer 130(A) may comprise a document type extraction layer that may analyze the content of the document and extract a feature value related to portions of the document 100 comprising image, text, white space, margins, etc. Extraction layer 130(B) may comprise a font extraction layer that may extract a feature value related to the number, type, and size of fonts utilized in the document 100. Extraction layer 130(C) may comprise a color extraction layer that may extract a feature value related to the color depth and/or palette used in the document 100. Extraction layer 130(D) may comprise a text extraction layer that may apply the count-based and/or predictive models described above to extract feature values associated with any text in document 100. Extraction layer 130(A) may comprise an image feature extraction layer that may extract a feature value related to edge detection, shapes, facial recognition, etc. in document 100. The values from any of the extraction layers 130(A)-(E) may be combined into a multi-dimensional vector representation of the document, and values from each layer may be weighted, such as according to a type of the document. Although several example of feature extraction layers are given, these are not intended to be exclusive or limiting and any number of other features may be extracted. Additionally, multiple layers may be used to extract similar features, such as one text feature extraction layer applying a count-based model and a different text feature extraction model applying a predictive model.

Figure 2:
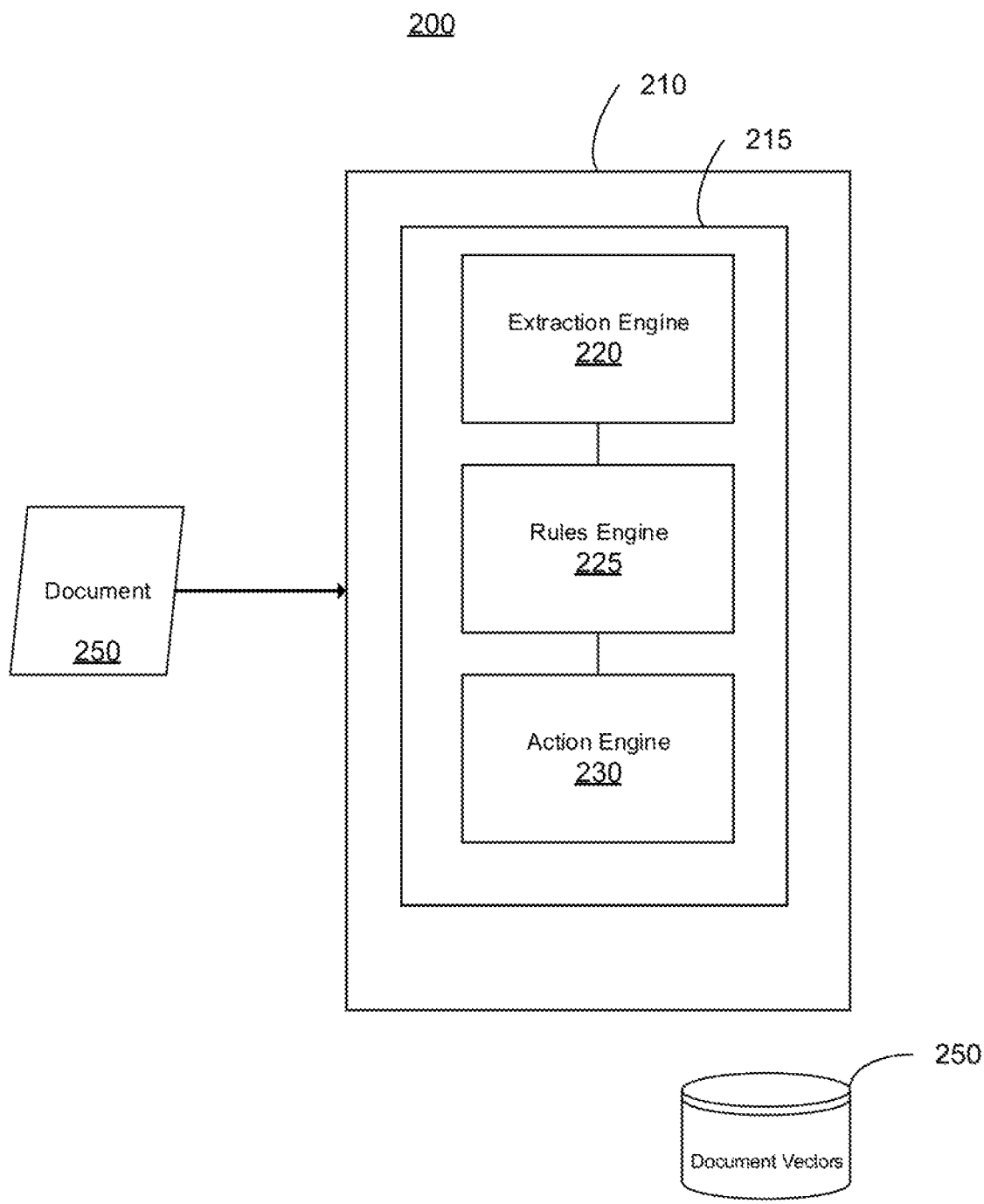
FIG. 2 is an example system for providing document security.

FIG. 2 is a block diagram of an example document security system 200. System 200 may comprise a computing device 210 comprising a memory 215. Computing device 210 may comprise, for example, a general and/or special purpose computer, server, mainframe, desktop, laptop, tablet, smart phone, game console, printer and/or any other system capable of providing computing capability consistent with providing the implementations described herein. Computing device 210 may store, in memory 215, an extraction engine 220, a rules engine 225, and an action engine 230.

Each of engines 220, 225, 230 of system 200 may comprise any combination of hardware and programming to implement the functionalities of the respective engine. In examples described herein, such combinations of hardware and programming may be implemented in a number of different ways. For example, the programming for the engines may be processor executable instructions stored on a non-transitory machine-readable storage medium and the hardware for the engines may include a processing resource to execute those instructions. In such examples, the machine-readable storage medium may store instructions that, when executed by the processing resource, implement engines 220, 225, 230. In such examples, system 200 may comprise the machine-readable storage medium storing the instructions and the processing resource to execute the instructions, or the machine-readable storage medium may be separate but accessible to system 200 and the processing resource.

Extraction engine 220 may extract a plurality of features from a document 250, generate a vector representation of the document 250 according to the plurality of extracted features, and store the vector representation of the document 250 in a database of document vector representations 250. Such a document may comprise a physical, hardcopy document and/or a digital document. Extraction engine 220 may comprise a machine-learning based heuristic extraction model such as extraction model 100. A heuristic model is one that may be adaptively altered as new data is processed by the model. For example, repeated extraction of similar documents may reveal which features provide greater differentiation and/or accuracy. The weighting of those features may be raised and/or lowered to improve the resolution of the model. The generated vector representation may comprise a multi-dimensional vector comprising the results of the different feature extraction layers and those layers' weightings. The vector representation may be stored in a database with other documents' vector representations, and may be used in conjunction with devices and/or applications to identify security rules associated with the document 250.

Extracted features may differ for different documents and may be selected, for example, from a plurality of feature extraction layers 130(A)-(E). Such features may be extracted and translated into values for inclusion in a vector representation. The features extracted from the document may comprise, for example, font features, margin measurements, a color analysis (e.g., palette and/or depth), a layout analysis (e.g., relative positions and/or sizes of elements of the document). For example, layers 130(A)-(E) of the CNN model may work to build a feature space, and encode k-dimensional feature vectors. For example, an initial layer 130(A) may learn first order features, e.g. color, edges etc. A second layer 130(B) may learn higher order features, e.g., features specific to the input dataset.

Rules engine 225 may associate at least one security rule with the document 250. Security rules may comprise restrictions on various activities involving the document. For example, a security rule may provide a print restriction (e.g., preventing printing the document), a copy restriction (e.g., creating a digital or physical copy of the document, such as by photographing and/or scanning the document), a transmission restriction (e.g., preventing emailing or otherwise sharing the document electronically), and a user restriction (e.g., preventing a certain user from creating a copy, printing, sending, and/or receiving the document). In some implementations, rules engine 225 may also create a log entry associated with document 250 when an action is attempted on the document, including whether the action was denied or permitted by a security rule.

Action engine 230 may determine if a received vector representation matches the stored vector representation of the document, and, in response to determining that the received vector representation matches the stored vector representation of the document, apply the at least one security rule associated with the document to a requested action. To make the determination, for example, action engine 230 may calculate a distance score between the received vector representation and each of the stored vector representations in database 250. the distance score may need to be lower than a dynamic threshold value to comprise a match between the received vector representation and the stored vector representation and/or the lowest distance score between the received vector representation and one of the stored vector representations may be deemed to comprise a match. Database 250 may be optimized, such as in a binary tree and/or other structure, to reduce the time to find a matching stored vector representation.

Upon detecting a matching stored vector representation, action engine 230 may determine whether security rules associated with the stored vector representation permit the requested action. For example, a user may be attempting to photograph document 250 using a smartphone camera. The smartphone may capture the image of the document long enough to run document 250 through extraction model 100 and generate a vector representation. In some implementations, extraction model 100 may operate on the smartphone itself and/or may be provided via a communicatively coupled network device, such as extraction engine 220 on computing device 210. The security rule check may be imposed, for example, by a policy on the smartphone disabling the functionality of the camera until approval is received from action engine 230. The newly extracted vector representation may be compared to stored vector representations in database 250 and security rules associated with the matching stored vector representation (if any) may be retrieved. If document 250 is determined to be associated with a security rule prohibiting copying, then action engine 230 may instruct the smartphone not to permit the camera to capture an image of the document and delete the data used to generate the vector representation.

Although one computing device 210 is depicted in FIG. 2, certain implementations of system 200 may comprise more than one computing device 210. At least one of the computing devices may be employed and arranged, for example, in at least one server bank, computer bank, data center, and/or other arrangements. For example, the computing devices together may include a cloud computing resource, a grid computing resource, and/or any other distributed computing arrangement. Such computing devices may be located in a single installation and/or may be distributed among many different geographical locations.

Figure 3:
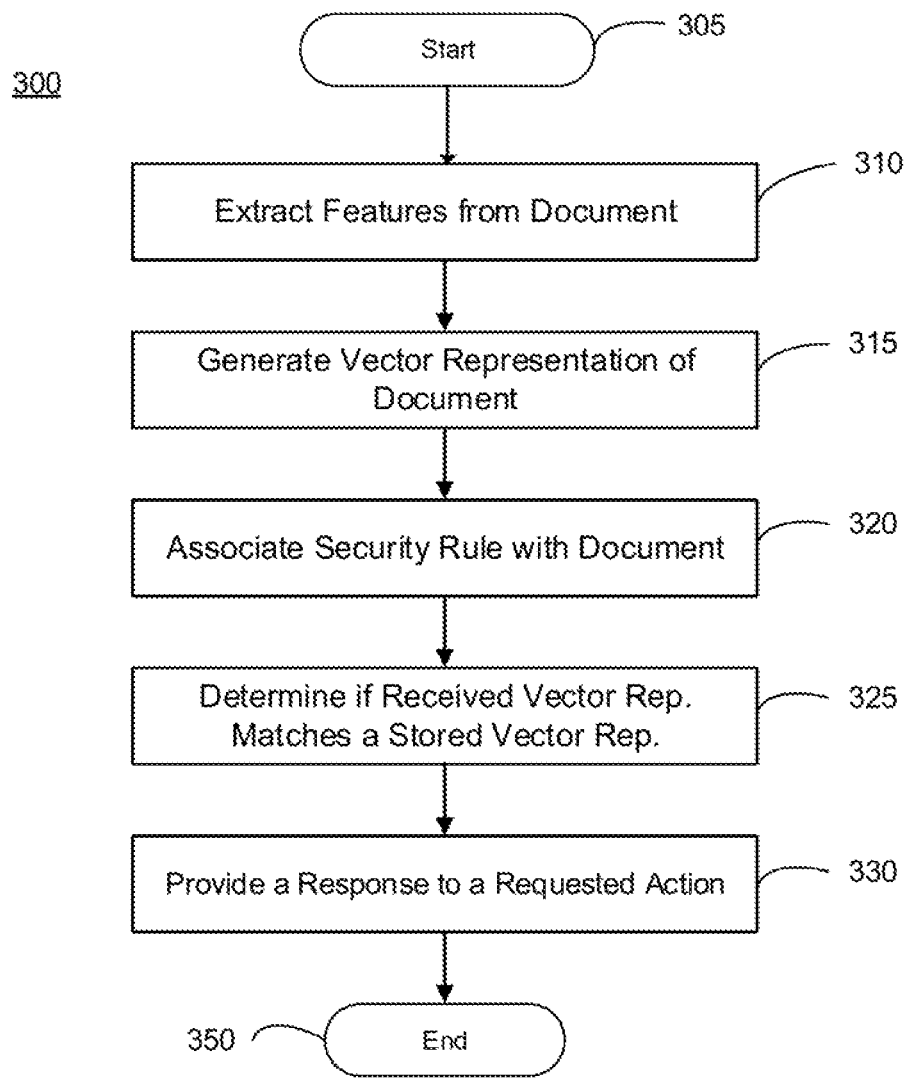
FIG. 3 is a flowchart of an example of a method for providing document security.

FIG. 3 is a flowchart of an example method 300 for providing document security. Although execution of method 300 is described below with reference to computing device 210, other suitable components for execution of method 300 may be used.

Method 300 may begin in stage 305 and proceed to stage 315 where computing device 210 may extract a plurality of features from a document according to a heuristic extraction model. For example, extraction engine 220 may comprise a heuristic extraction model such as extraction model 100. A heuristic model is one that may be adaptively altered as new data is processed by the model. For example, repeated extraction of similar documents may reveal which features provide greater differentiation and/or accuracy. Extracted features may differ for different documents and may be adaptively selected, for example, from a plurality of feature extraction layers 130(A)-(E).

Such features may be extracted and translated into values for inclusion in a vector representation. The features extracted from the document may comprise, for example, font features, margin measurements, a color analysis (e.g., palette and/or depth), a layout analysis (e.g., relative positions and/or sizes of elements of the document).

A heuristic model is one that may be adaptively altered as new data is processed by the model. For example, repeated extraction of similar documents may reveal which features provide greater differentiation and/or accuracy. The weighting of those features may be raised and/or lowered to improve the resolution of the model. In some implementations, each feature extraction layer may be associated with an adaptive weight for each of a plurality of document types. For example, a text feature extraction layer may have a high weight for a primarily text-based document but a low weight for a primarily image-based document.

Method 300 may then advance to stage 315 where computing device 210 may generate a vector representation of the document according to the plurality of extracted features. The generated vector representation may comprise a multi-dimensional vector comprising the results of the different feature extraction layers and those layers weightings. The vector representation may be stored in a database with other documents' vector representations, and may be used in conjunction with devices and/or applications to identify security rules associated with the document 250.

Method 300 may then advance to stage 320 where computing device 210 may associate at least one security rule with the document. For example, rules engine 225 may associate at least one security rule with the document 250. Security rules may comprise restrictions on various activities involving the document. For example, a security rule may provide a print restriction (e.g., preventing printing the document), a copy restriction (e.g., creating a digital or physical copy of the document, such as by photographing and/or scanning the document), a transmission restriction (e.g., preventing emailing or otherwise sharing the document electronically), and a user restriction (e.g., preventing a certain user from creating a copy, printing, sending, and/or receiving the document). In some implementations, rules engine 225 may also create a log entry associated with document 250 when an action is attempted on the document, including whether the action was denied or permitted by a security rule.

Method 300 may then advance to stage 325 where computing device 210 may determine if a received vector representation matches the stored vector representation of the document. For example, action engine 230 may determine if a received vector representation matches the stored vector representation of the document, and, in response to determining that the received vector representation matches the stored vector representation of the document, apply the at least one security rule associated with the document to a requested action. To make the determination, for example, action engine 230 may calculate a distance score between the received vector representation and each of the stored vector representations in database 250. The distance score may need to be lower than a dynamic threshold value to comprise a match between the received vector representation and the stored vector representation and/or the lowest distance score between the received vector representation and one of the stored vector representations may be deemed to comprise a match. The dynamic threshold value may be configurable by a user and may be dependent on an application's needs, such as enforcing accuracy and speed of processing. Database 250 may be optimized, such as in a binary tree and/or other structure, to reduce the time to find a matching stored vector representation.

Method 300 may then advance to stage 330 where computing device 210 may provide a response to a requested action on the document according to the determination. For example, upon detecting a matching stored vector representation, action engine 230 may determine whether security rules associated with the stored vector representation permit the requested action. For example, a user may be attempting to photograph document 250 using a smartphone camera. The smartphone may capture the image of the document long enough to run document 250 through extraction model 100 and generate a vector representation. In some implementations, extraction model 100 may operate on the smartphone itself and/or may be provided via a communicatively coupled network device, such as extraction engine 220 on computing device 210. The security rule check may be imposed, for example, by a policy on the smartphone disabling the functionality of the camera until approval is received from action engine 230. The newly extracted vector representation may be compared to stored vector representations in database 250 and security rules associated with the matching stored vector representation (if any) may be retrieved. If document 250 is determined to be associated with a security rule prohibiting copying, then action engine 230 may instruct the smartphone not to permit the camera to capture an image of the document and delete the data used to generate the vector representation.

Method 300 may then end at stage 350.

Figure 4:
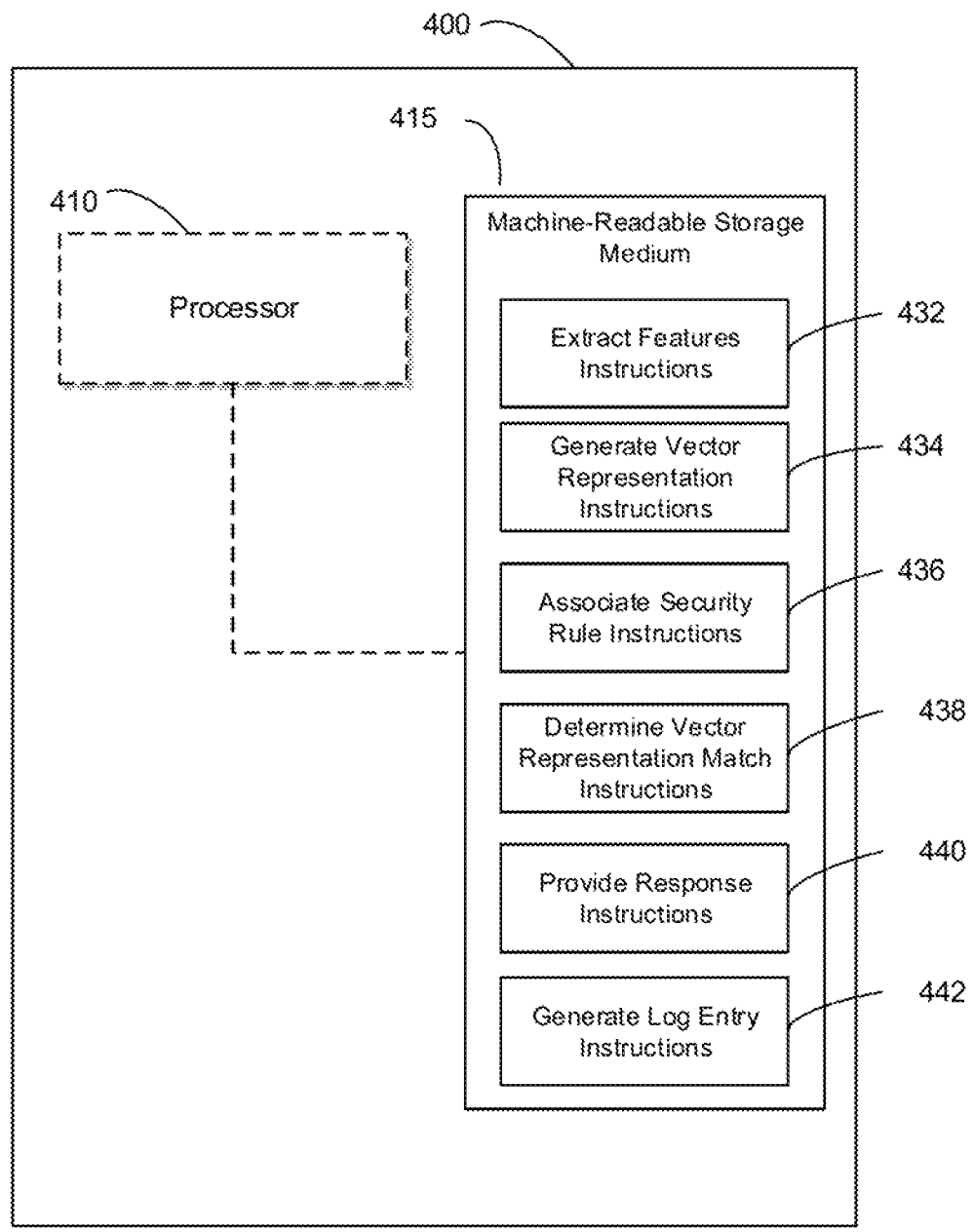
FIG. 4 is a block diagram of an example computing device for providing document security.

FIG. 4 is a block diagram of an example computing device 400 for providing document security. Computing device 400 may comprise a processor 410 and a memory 415 comprising a non-transitory, machine-readable storage medium. Memory 415 may comprise a plurality of processor-executable instructions, such as extract features instructions 432, generate vector representation instructions 434, associated security rule instructions 436, determine vector match instructions 438, provide response instructions 440, and generate log entry instructions 442. In some implementations, instructions 432, 434, 436, 438, 440, 442 may be associated with a single computing device 400 and/or may be communicatively coupled among different computing devices such as via a direct connection, bus, or network.

Processor 410 may comprise a central processing unit (CPU), a semiconductor-based microprocessor, a programmable component such as a complex programmable logic device (CPLD) and/or field-programmable gate array (FPGA), or any other hardware device suitable for retrieval and execution of instructions stored in machine-readable storage medium 420. In particular, processor 110 may fetch, decode, and execute instructions 432, 434, 436, 438, 440, 442.

Executable instructions 432, 434, 436, 438, 440, 442 may comprise logic stored in any portion and/or component of machine-readable storage medium 415 and executable by processor 410. The machine-readable storage medium 415 may comprise both volatile and/or nonvolatile memory and data storage components. Volatile components are those that do not retain data values upon loss of power. Nonvolatile components are those that retain data upon a loss of power.

The machine-readable storage medium 415 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, and/or a combination of any two and/or more of these memory components. In addition, the RAM may comprise, for example, static random access memory (SRAM), dynamic random access memory (DRAM), and/or magnetic random access memory (MRAM) and other such devices. The ROM may comprise, for example, a programmable read-only memory (PROM), an erasable programmable read-only memory (EPROM), an electrically erasable programmable read-only memory (EEPROM), and/or other like memory device.

Extract features instructions 432 may extract a plurality of features from a document according to a heuristic extraction model, wherein the heuristic extraction model adaptively selects from a plurality of feature types for extracting the plurality of features. For example, extraction engine 220 may comprise a heuristic extraction model such as extraction model 100. A heuristic model is one that may be adaptively altered as new data is processed by the model. For example, repeated extraction of similar documents may reveal which features provide greater differentiation and/or accuracy. Extracted features may differ for different documents and may be adaptively selected, for example, from a plurality of feature extraction layers 130(A)-(E). Such features may be extracted and translated into values for inclusion in a vector representation. The features extracted from the document may comprise, for example, font features, margin measurements, a color analysis (e.g., palette and/or depth), a layout analysis (e.g., relative positions and/or sizes of elements of the document).

A heuristic model is one that may be adaptively altered as new data is processed by the model. For example, repeated extraction of similar documents may reveal which features provide greater differentiation and/or accuracy. The weighting of those features may be raised and/or lowered to improve the resolution of the model. In some implementations, each feature extraction layer may be associated with an adaptive weight for each of a plurality of document types. For example, a text feature extraction layer may have a high weight for a primarily text-based document but a low weight for a primarily image-based document.

Generate vector representation instructions 434 may generate a vector representation of the document according to the plurality of extracted features. The generated vector representation may comprise a multi-dimensional vector comprising the results of the different feature extraction layers and those layers weightings. The vector representation may be stored in a database with other documents' vector representations, and may be used in conjunction with devices and/or applications to identify security rules associated with the document 250.

Associate security rule instructions 436 may associate at least one security rule with the document. For example, rules engine 225 may associate at least one security rule with the document 250. Security rules may comprise restrictions on various activities involving the document. For example, a security rule may provide a print restriction (e.g., preventing printing the document), a copy restriction (e.g., creating a digital or physical copy of the document, such as by photographing and/or scanning the document), a transmission restriction (e.g., preventing emailing or otherwise sharing the document electronically), and a user restriction (e.g., preventing a certain user from creating a copy, printing, sending, and/or receiving the document.

Determine vector match instructions 438 may determine if a received vector representation matches the stored vector representation of the document. For example, action engine 230 may determine if a received vector representation matches the stored vector representation of the document, and, in response to determining that the received vector representation matches the stored vector representation of the document, apply the at least one security rule associated with the document to a requested action. To make the determination, for example, action engine 230 may calculate a distance score between the received vector representation and each of the stored vector representations in database 250. the distance score may need to be lower than a dynamic threshold value to comprise a match between the received vector representation and the stored vector representation and/or the lowest distance score between the received vector representation and one of the stored vector representations may be deemed to comprise a match. Database 250 may be optimized, such as in a binary tree and/or other structure, to reduce the time to find a matching stored vector representation.

Provide response instructions 440 may, in response to determining that the received vector representation matches the stored vector representation of the document, provide a response to a requested action on the document according to the security rule associated with the document. For example, upon detecting a matching stored vector representation, action engine 230 may determine whether security rules associated with the stored vector representation permit the requested action. For example, a user may be attempting to photograph document 250 using a smartphone camera. The smartphone may capture the image of the document long enough to run document 250 through extraction model 100 and generate a vector representation. In some implementations, extraction model 100 may operate on the smartphone itself and/or may be provided via a communicatively coupled network device, such as extraction engine 220 on computing device 210. The security rule check may be imposed, for example, by a policy on the smartphone disabling the functionality of the camera until approval is received from action engine 230. The newly extracted vector representation may be compared to stored vector representations in database 250 and security rules associated with the matching stored vector representation (if any) may be retrieved. If document 250 is determined to be associated with a security rule prohibiting copying, then action engine 230 may instruct the smartphone not to permit the camera to capture an image of the document and delete the data used to generate the vector representation.

Generate log entry instructions 442 may generate a log entry associated with the document. For example, in some implementations, rules engine 225 may create a log entry associated with document 250 when an action is attempted on the document, including whether the action was denied or permitted by a security rule.

The disclosed examples may include systems, devices, computer-readable storage media, and methods for document element re-positioning. For purposes of explanation, certain examples are described with reference to the components illustrated in the Figures. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples.

Moreover, as used in the specification and the appended claims, the singular forms "a," "an," and "the" are intended to include the plural forms as well, unless the context indicates otherwise. Additionally, although the terms first, second, etc. may be used herein to describe various elements, these elements should not be limited by these terms. Instead, these terms are only used to distinguish one element from another.

Further, the sequence of operations described in connection with the Figures are examples and are not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. All such modifications and variations are intended to be included within the scope of this disclosure and protected by the following claims.

What is claimed is:

1. A system, comprising:
    an extraction engine to:
        extract a plurality of features from an individual document,
        generate a vector representation of the individual document according to the plurality of extracted features, and
        store the vector representation of the individual document in a database of document vector representations;
    a rules engine to:
        associate at least one security rule with the individual document; and
    an action engine to:
        receive a new vector representation of the individual document,
        determine if the received new vector representation of the individual document matches the stored vector representation of the individual document, and
        in response to determining that the received new vector representation of the individual document matches the stored vector representation of the individual document, apply the at least one security rule associated with the individual document to a requested action.

2. The system of claim 1, wherein the extracted plurality of features comprise a plurality of font features.

3. The system of claim 1, wherein the extracted plurality of features comprise a plurality of margin measurements.

4. The system of claim 1, wherein the extracted plurality of features comprise a color analysis of the individual document.

5. The system of claim 1, wherein the extracted plurality of features comprise a layout analysis of the individual document.

6. The system of claim 1, wherein the at least one security rule comprises at least one of the following: a print restriction, a copy restriction, a transmission restriction, and a user restriction.

7. The system of claim 1, wherein the plurality of features are extracted from the individual document according to a heuristic extraction model.

8. The system of claim 1, wherein the rules engine, in response to determining that the received vector representation matches the stored vector representation of the individual document, generates a log entry associated with the individual document.

9. The system of claim 1, wherein the rules engine, to determine if the received vector representation matches the stored vector representation, calculates a distance score between the received vector representation and the stored vector representation.

10. The system of claim 9, wherein the distance score is to be lower than a dynamic threshold value to comprise a match between the received vector representation and the stored vector representation.

11. A method comprising:
    extracting a plurality of features from an individual document according to a heuristic extraction model;

generating a vector representation of the individual document according to the plurality of extracted features;

storing the vector representation of the individual document;

associating at least one security rule with the individual document;

receiving a new vector representation of the individual document;

determining if the received new vector representation of the individual document matches the stored vector representation of the individual document; and providing a response to a requested action on the individual document according to the determination, including applying the at least one security rule in response to determining that the received new vector representation of the individual document matches the stored vector representation of the individual document.

12. The method of claim 11, wherein the heuristic extraction model adaptively selects from a plurality of feature types for extracting the plurality of features.

13. The method of claim 12, wherein the heuristic extraction model comprise a plurality of extraction layers, wherein each extraction layer is associated with one of the plurality of feature types.

14. The method of claim 13, wherein each extraction layer is associated with an adaptive weight for each of a plurality of document types.

15. A non-transitory machine readable medium storing instructions executable by a processor to:

extract a plurality of features from an individual document according to a heuristic extraction model, wherein the heuristic extraction model adaptively selects from a plurality of feature types for extracting the plurality of features;

generate a vector representation of the individual document according to the plurality of extracted features;

store the vector representation of the individual document;

associate at least one security rule with the individual document;

receive a new vector representation of the individual document;

determine if the received new vector representation of the individual document matches the stored vector representation of the individual document; and in response to determining that the received new vector representation of the individual document matches the stored vector representation of the individual document:

apply the at least one security rule associated with the individual document to a requested action on the individual document, and generate a log entry associated with the individual document.

* * * * *